(12) United States Patent
Friedl et al.

(10) Patent No.: US 12,207,402 B2
(45) Date of Patent: Jan. 21, 2025

(54) PRINTED CIRCUIT BOARD FOR TRANSMITTING ELECTRICAL ENERGY AND FOR SIGNAL TRANSMISSION AND SYSTEM HAVING SUCH A PRINTED CIRCUIT BOARD

(71) Applicant: Airbus Defence and Space GmbH, Taufkirchen (DE)

(72) Inventors: Stephan Friedl, Taufkirchen (DE); Florian Kapaun, Taufkirchen (DE)

(73) Assignee: Airbus Defence and Space GmbH, Taufkirchen (DE)

( * ) Notice: Subject to any disclaimer, the term of this patent is extended or adjusted under 35 U.S.C. 154(b) by 68 days.

(21) Appl. No.: 17/573,807

(22) Filed: Jan. 12, 2022

(65) Prior Publication Data

US 2022/0225499 A1 Jul. 14, 2022

(30) Foreign Application Priority Data

Jan. 12, 2021 (DE) ...................... 10 2021 100 398.9

(51) Int. Cl.
*H05K 1/09* (2006.01)
*H05K 1/02* (2006.01)
(Continued)

(52) U.S. Cl.
CPC ............. *H05K 1/09* (2013.01); *H05K 1/0298* (2013.01); *H05K 1/11* (2013.01); *H10N 60/80* (2023.02); *H05K 1/0263* (2013.01); *H05K 1/18* (2013.01)

(58) Field of Classification Search
CPC .......... H05K 1/09; H05K 1/0298; H05K 1/11; H05K 2201/0379; H05K 3/103; H05K 1/0263; H05K 2201/1028; H10N 60/80
See application file for complete search history.

(56) References Cited

U.S. PATENT DOCUMENTS 3,612,742 A * 10/1971 Snowden ............... H01B 12/02
174/105 R
4,988,669 A * 1/1991 Dersch ................. H10N 60/203
505/231

(Continued)

FOREIGN PATENT DOCUMENTS

DE 10 2012 008 514 A1 11/2013
EP 3 745 827 A1 12/2020
(Continued)

OTHER PUBLICATIONS

European Search Report for U.S. Appl. No. 22/150,843 dated May 23, 2022.
(Continued)

*Primary Examiner* — Ishwarbhai B Patel
(74) *Attorney, Agent, or Firm* — KDW Firm PLLC

(57) ABSTRACT

A printed circuit board for transmitting electrical energy and for signal transmission includes electrical conductor tracks coupled to the printed circuit board wherein the electrical conductor tracks include a first electrical conductor track with a superconducting material. The first electrical conductor track is designed to provide electrical energy directly to a power electronics system. The electrical conductor tracks include a second electrical conductor track which is designed to provide a signal transmission to a signal electronics system. A system is disclosed having such a printed circuit board.

14 Claims, 3 Drawing Sheets

(51) Int. Cl.
  *H05K 1/11*   (2006.01)
  *H10N 60/80*  (2023.01)
  *H05K 1/18*   (2006.01)

(56) References Cited

U.S. PATENT DOCUMENTS

| | | | | |
|---|---|---|---|---|
| 5,476,719 | A * | 12/1995 | Sandell | H01L 23/5383 428/209 |
| 5,866,195 | A * | 2/1999 | Lemelson | C23C 28/3455 427/249.7 |
| 6,510,604 | B1 * | 1/2003 | Pourrahimi | H01F 6/06 29/599 |
| 8,716,188 | B2 * | 5/2014 | Xie | H10N 60/203 29/599 |
| 9,972,423 | B2 * | 5/2018 | Otto | H01B 12/06 |
| 2008/0128158 | A1 | 6/2008 | Wolfel | |
| 2015/0080225 | A1 | 3/2015 | Nomura et al. | |
| 2015/0248952 | A1 * | 9/2015 | Ko | H10N 60/01 428/381 |
| 2019/0131512 | A1 * | 5/2019 | Solovyov | H10N 60/0801 |
| 2019/0215952 | A1 * | 7/2019 | Lucero | H05K 1/184 |

FOREIGN PATENT DOCUMENTS

| | | |
|---|---|---|
| JP | S64789 A | 1/1989 |
| JP | H01145888 A | 6/1989 |
| JP | H0744323 B2 | 5/1995 |

OTHER PUBLICATIONS

German Search Report for Application No. 102021100398 dated Sep. 9, 2021.

* cited by examiner

PRINTED CIRCUIT BOARD FOR TRANSMITTING ELECTRICAL ENERGY AND FOR SIGNAL TRANSMISSION AND SYSTEM HAVING SUCH A PRINTED CIRCUIT BOARD

CROSS-REFERENCE TO RELATED APPLICATION

This application claims priority to German Patent Application No. 10 2021 100 398.9 filed Jan. 12, 2021, the entire disclosure of which is incorporated by reference herein

TECHNICAL FIELD

The disclosure herein relates to printed circuit boards with superconducting properties. In particular, the disclosure herein relates to a printed circuit board for transmitting electrical energy and for signal transmission. The disclosure herein also relates to a system having such a printed circuit board.

BACKGROUND

Superconduction is currently used predominantly for generators, energy transmission or electric motors. The respectively required power electronics system is in this case of conventional structure and is located in environments with normal temperature ranges, such as for example ambient temperature, while cryogenic temperature ranges are necessary for superconduction. This leads to unfavorable interfaces in the conductor tracks with great temperature transitions and significant cross-sectional changes since in general conductor tracks made of copper or copper rails are used. This technology has a great influence on the weight of the respective system and may therefore for this reason alone be disadvantageous for such applications in which weight savings are of particular interest. The great temperature transitions in the conductor tracks mentioned also have a disadvantageous effect from a technical point of view.

SUMMARY

It is an object of the disclosure herein to reduce the weight of electrical systems having power electronics systems.

This object is achieved by the disclosure herein. Example embodiments are disclosed in the following description.

In accordance with one aspect of the disclosure herein, a printed circuit board for transmitting electrical energy and for signal transmission is specified. The printed circuit board comprises a plurality of electrical conductor tracks coupled to the printed circuit board. The plurality of electrical conductor tracks comprises a first electrical conductor track comprising a superconducting material, that is to say a superconductor. The first electrical conductor track is designed to provide electrical energy directly to a power electronics system. The plurality of electrical conductor tracks also comprises a second electrical conductor track which is designed to provide a signal transmission to a signal electronics system.

Such a printed circuit board on which a conductor track with superconducting material properties is arranged makes it possible to supply large amounts of current to the power electronics systems which is coupled to the superconducting conductor track and in the process to save weight since it is possible to dispense with heavy copper conductor tracks with large dimensions or the use thereof can be reduced. The printed circuit board according to the disclosure herein makes it possible to use high-current conductor tracks and driver electronic systems on one and the same printed circuit board and at the same time to prevent great temperature transitions in the conductor track by virtue of for example the printed circuit board having a superconducting conductor track and also the power electronics system being used in a cryogenic temperature range. Such a printed circuit board may be used in particular in a weight-reducing design with multiphase applications. In an advantageous example application, driver electronics systems and current collectors are coupled directly on the printed circuit board according to the disclosure herein or are integrated therein.

The printed circuit board may be a carrier for electronic components, in particular a power electronics system. The printed circuit board may be referred to as a PCB.

The printed circuit board is designed to transmit electrical energy in the form of electric current and also for signal transmission, that is to say data and information transmission. In this case, the current and signal transmission takes place via the plurality of conductor tracks which are preferably coupled directly to the printed circuit board. By way of example, the plurality of printed circuit boards are printed or soldered onto the printed circuit board or are integrated directly into the printed circuit board in another manner.

The plurality of electrical conductor tracks comprises a first electrical conductor track comprising a superconducting material. The first electrical conductor track thus comprises a material whose electrical resistance becomes very low when the transition temperature is undershot, for example falls to below $10^{-20}$ W. In one example, the printed circuit board according to the disclosure herein, but at least the first conductor track, is operated in a temperature range in which the transition temperature for the superconducting material is undershot, for example in a temperature range of approximately 21 K to approximately 77 K.

The first electrical conductor track, which may also be referred to simply as superconductor, is designed to provide electrical energy directly to a power electronics system and specifically such that the power electronics system is connected to the printed circuit board directly via the first electrical conductor track and without further intermediate conductor components. In one example, the power electronics system is integrated directly into the printed circuit board. The power electronics system may be an electrical converter, an electrical fuse or a miniature circuit breaker, an inverter or a power electronics system integrated in an electric motor.

The plurality of electrical conductor tracks also comprises a second electrical conductor track which is designed to provide a signal transmission to a signal electronics system. It is thus possible to provide a combined signal and power electronics system on one and the same printed circuit board, wherein a feed of electrical energy takes place via the first superconducting conductor track and signal transmission or information and data transmission may take place via the second conductor track. Both conductor tracks may in this case be arranged directly on the printed circuit board or be integrated therein.

In some embodiments, the power electronics system is integrated into the printed circuit board and/or the signal electronics system is integrated into the printed circuit board.

This means that the power electronics system is arranged directly in or on the printed circuit board. As an alternative or in addition, the signal electronics system may also be arranged directly in or on the printed circuit board. In this way, the printed circuit board together with the first and second conductor track and the power and signal electronics systems may be operated in a delimited cryogenic temperature range, as a result of which disadvantageous great temperature transitions in the conductor tracks are prevented. It is possible to dispense with the use of thick copper conductor tracks since the current feed takes place via the first conductor track with superconducting properties and the power electronics system connected thereto is located directly in or on the printed circuit board. Great cross-sectional transitions in the corresponding conductor tracks are therefore also prevented.

In some embodiments, the first electrical conductor track comprising superconducting material is designed to transmit electric current of at least 400 A.

By way of example, the first electrical conductor track may transmit an electric current of at least 420 A, at least 450 A or at least 480 A. The first electrical conductor track may also be designed to transmit an electric current of up to 500 A.

In some embodiments, the first electrical conductor track comprising superconducting material is designed in the form of a thin strip, which is embedded in a frame of the printed circuit board.

The first electrical conductor track may be constructed from several materials or layers. These include, inter alia, a ceramic layer, a silver contact layer and a copper sheath. The frame of the printed circuit board may be formed by an electrically non-conductive or poorly conductive material, such as plastic, for example. The first electrical conductor track may be produced by a physical vapor deposition (PVD) method. The first electrical conductor track and other superconductors of the arrangement may also, however, be placed directly or metallized intermediate layers may be produced as carrier.

In some embodiments, the strip of the first electrical conductor track has a width of at least 10 mm and a height of at most 0.1 mm or at most 0.08 mm.

The configuration in the form of a thin strip offers advantages in particular with respect to saving space.

In some embodiments, the printed circuit board further comprises an electrical terminal connection which is designed to connect the first electrical conductor track to the power electronics system or to an energy source, wherein the electrical terminal connection is formed at a first end in the manner of a connection screw which projects out of a surface of the printed circuit board and can be connected to the power electronics system or to the energy source, and wherein the electrical terminal connection is soldered at a second end to the first electrical conductor track.

In this way, an interface between the first conductor track and the printed circuit board may be produced, the interface making it possible to integrate the first conductor track into the printed circuit board in a flexible manner. The terminal connection may therefore be provided in the form of a screw connection. A press fit in the region of the second end of the terminal connection may be used to secure the screw connection in the printed circuit board. In particular, the press fit is used here purely for mechanical securing, wherein a materially bonded connection, for example a solder connection, to the first conductor track or the superconductor is necessary for the electrical connection.

In some embodiments, the electrical terminal connection has at its second end an interface region for connecting the electrical terminal connection to the first electrical conductor track, wherein the interface region has an electrically conductive contact surface of at least 140 mm$^2$.

This interface region may be formed in the manner of a solder connection in order to ensure the electrical contact between the terminal connection and the first conductor track. It is thus possible to provide a comparatively large contact region between the first conductor track comprising superconducting material and the terminal connection, with the result that the large amounts of current provided by the first conductor track are transmitted via the terminal connection to the power electronics system which may be coupled directly to the terminal connection.

In some embodiments, the plurality of electrical conductor tracks includes a further electrical conductor track which comprises a superconducting material and is designed in the form of a strip.

The printed circuit board may thus comprise a plurality of conductor tracks which have superconducting properties and may therefore transmit large amounts of current in a space-saving manner.

In some embodiments, the first electrical conductor track comprising superconducting material and the further electrical conductor track comprising superconducting material are provided in a stacked arrangement in or on a frame of the printed circuit board.

In other words, a plurality of conductor tracks, that is to say three, four or even more conductor tracks, may be provided on or in the frame of the printed circuit board. The stacked arrangement is an example in which the conductor tracks are arranged directly one above the other and thus run in parallel, which makes even greater current transmissions possible. Through the stacking of two strips, for example overlapping strips may be arranged in different directions and thus produce complex structures. The conductor tracks, of which each may be designed in the form of a thin strip, as described above, may each be connected to one another by way of solder connections. The stacked arrangement that is soldered together may advantageously be integrated into the printed circuit board as a single component during the production of the printed circuit board. For the case of a stack of three superconductors, the parallel circuit formed thereby may be used to realize electric currents of up to 1500 A.

In some embodiments, the first electrical conductor track comprising superconducting material and the further electrical conductor track comprising superconducting material mutually cross one another, wherein the conductor tracks are soldered to one another in the region of the mutual crossing.

Using the superconducting conductor tracks, it is thus possible to provide complex conductor structures which are integrated directly on or in the printed circuit board or in the frame thereof. In this example, the conductor tracks may be soldered to one another over their entire width in order to provide the greatest possible contact surface which transmits the whole current amount between the different conductor tracks in a virtually loss-free manner. An electrical resistance of approximately 0.09 mW at 20° C. and even lower at an operating point can be realized. Provision may be made for the superconducting conductor tracks to be soldered to one another before integration into the printed circuit board and thereby be structured.

In accordance with an aspect of the disclosure herein, a system is specified. The system comprises the printed circuit board according to the disclosure herein which is described above and below. The printed circuit board is in this case arranged together with the power electronics system and for example also the signal electronics system in a region of the system which has cryogenic temperature properties.

This means that on the one hand the printed circuit board together with its superconducting components, in particular the first conductor track, is operated in the cryogenic temperature range in order to realize the superconducting properties of the superconducting material. On the other hand, however, the power electronics system is also operated in the cryogenic temperature range. In this way, great temperature transitions in the conductor track which is connected to the power electronics system may be prevented. In particular, the first conductor track with superconducting material properties is coupled directly to the power electronics system. In one example, the power electronics system and the first conductor track are secured to the printed circuit board or integrated therein. Provision may be made for the conductor track to be secured in or on the frame of the printed circuit board and for the power electronics system to be attached to a surface of the printed circuit board.

The system may for example be part of an aircraft. In this case, cryogenic temperature properties may prevail in a delimited region of the aircraft, wherein the printed circuit board together with the first conductor track, the power electronics system and possibly also the signal electronics system are arranged in the delimited region with cryogenic temperature properties. Through this integration of superconductors on printed circuit boards, it is possible to prevent disadvantageous temperature transitions between the superconductors and the power or signal electronics system. It is thus possible to provide high energy densities and a high system efficiency.

The system may be part of a hybrid electric or a total electric drive architecture of a vehicle, in particular of an aircraft.

DETAILED DESCRIPTION

The depictions in the figures are schematic and not true to scale. Where the same reference signs are used in different figures in the description of the figures that follows, these denote identical or similar elements. Identical or similar elements may also be denoted by different reference signs, however.

Figure 1:
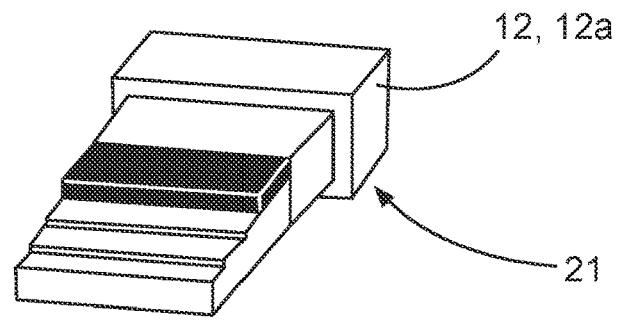
FIG. 1 shows a first conductor track comprising a superconducting material in accordance with an example embodiment.

FIG. 1 shows a first conductor track 12a comprising a superconducting material. The first conductor track 12a may be a high-temperature superconductor (HTS). The first conductor track has a multilayer structure, wherein the multilayer structure is surrounded by a copper sheath. The first conductor track 12a may be designed in the form of a thin, flat strip 21 which has a maximum thickness of 0.08 mm.

Figure 2:
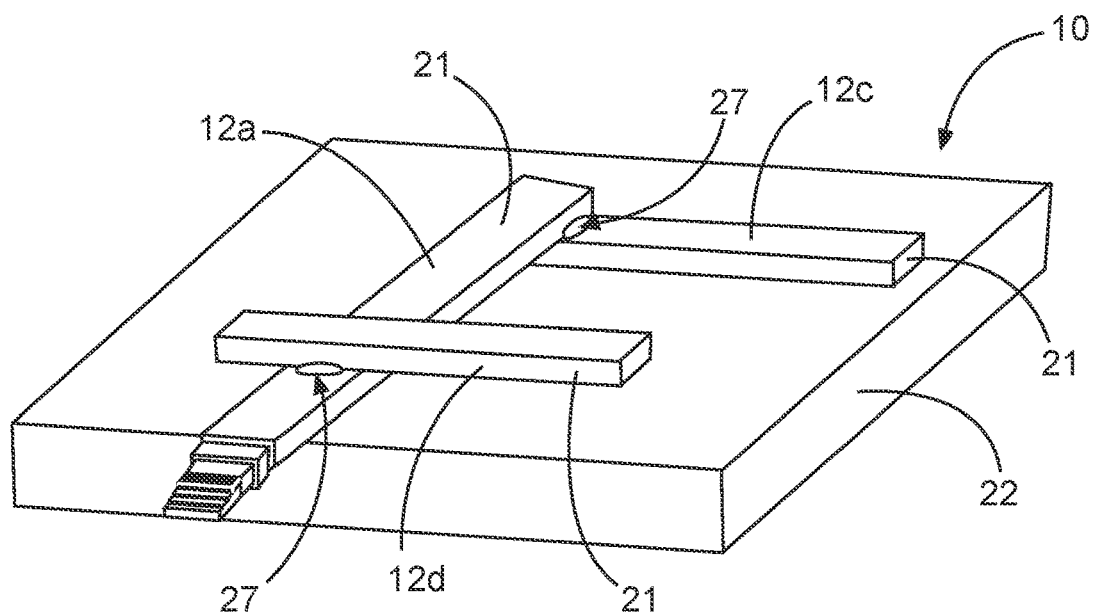
FIG. 2 shows an arrangement of a plurality of conductor tracks comprising superconducting material in accordance with an example embodiment.

FIG. 2 shows an arrangement of a plurality of conductor tracks 12a, 12c, 12d comprising superconducting material, which are described in relation to FIG. 1. All of these conductor tracks 12a, 12c, 12d are formed as strips 21 and secured to a frame 22 of a printed circuit board 10. The conductor tracks may mutually cross one another at crossings 27 in order to form a connecting or contact surface between them. The conductor tracks 12a, 12c, 12d are coupled to one another at the connecting surface by a solder connection. The conductor tracks are preferably each soldered to one another over their entire width in order to provide a maximum contact surface area.

Figure 3:
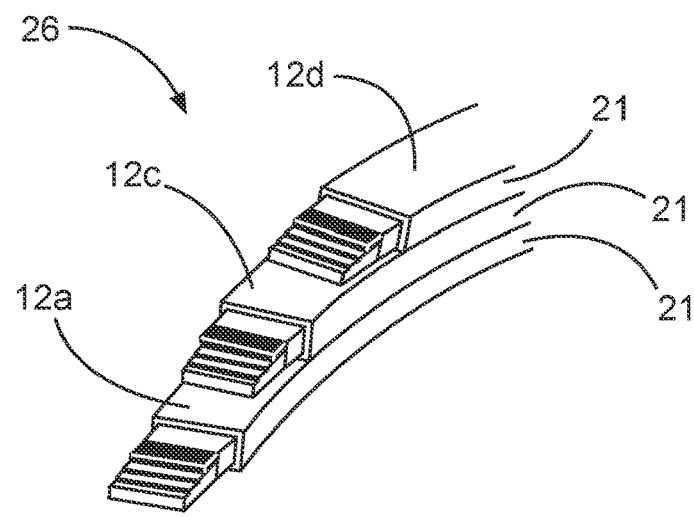
FIG. 3 shows a stacked arrangement of a plurality of conductor tracks comprising superconducting material in accordance with an example embodiment.

FIG. 3 shows a stacked arrangement 26 of a plurality of conductor tracks 12a, 12c, 12d comprising superconducting material. Even in the stacked arrangement 26, the conductor tracks 12a, 12c, 12d may each be coupled to one another via a solder connection. The solder connection may be provided in certain areas between the conductor tracks 12a, 12c, 12d such that the conductor tracks 12a, 12c, 12d are not soldered to one another over their entire length.

Figure 4:
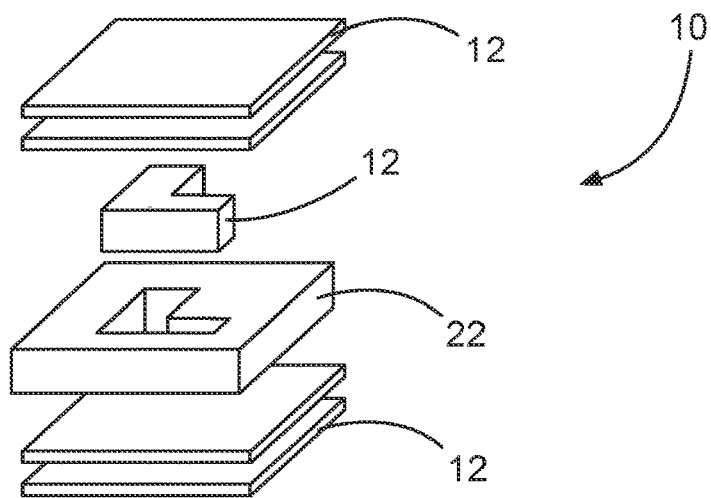
FIG. 4 schematically shows the structure of a printed circuit board in accordance with an example embodiment.

FIG. 4 schematically shows the structure of a printed circuit board 10 having a plurality of conductor tracks 12. The conductor tracks 12 may comprise conductor tracks 12 with superconducting material properties and likewise also conductor tracks with non-superconducting material properties. In one example, conductor tracks 12 with superconducting material properties may be used for the purpose of power supply, whereas the conductor tracks 12 with non-superconducting material properties are used for signal transmission. The conductor tracks 12 are held together mechanically by way of electrically non-conductive or electrically insulating components of the frame 22 of the printed circuit board 10. The conductor tracks 12 may be applied to the printed circuit board 10 in the region of the top layers and/or may be integrated or embedded in the frame 22 in the form of an inlay. The printed circuit board 10 may be produced by so-called "thick copper" technology with additional integration of the conductor tracks 12 with superconducting material properties.

Figures 5A, 5B:
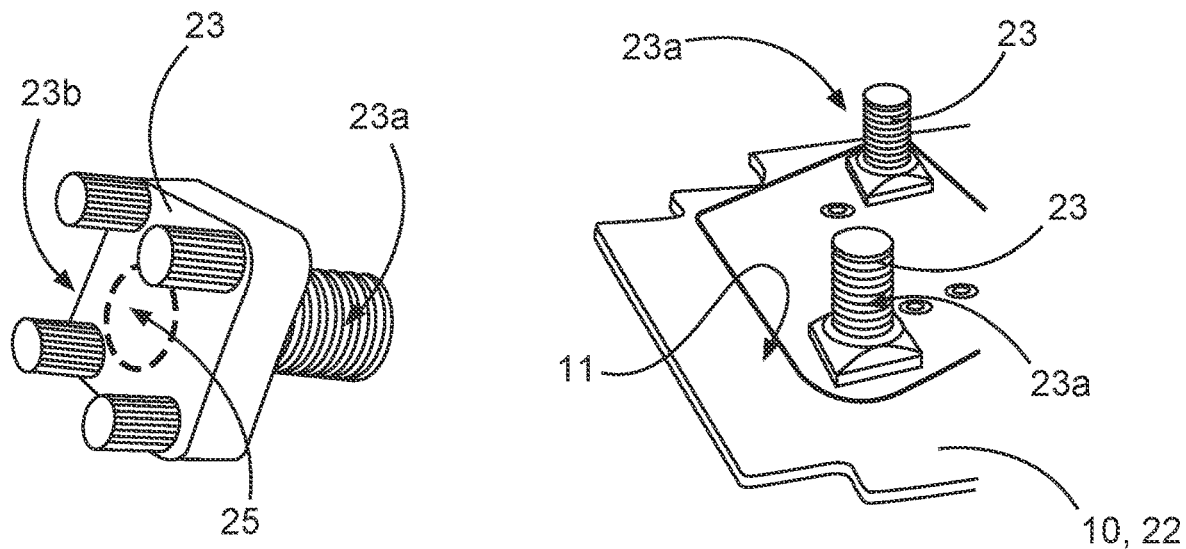
FIG. 5A shows an electrical terminal connection in accordance with an example embodiment.
FIG. 5B shows a printed circuit board having the electrical terminal connection from FIG. 5A in accordance with an example embodiment.
Figure 5C:
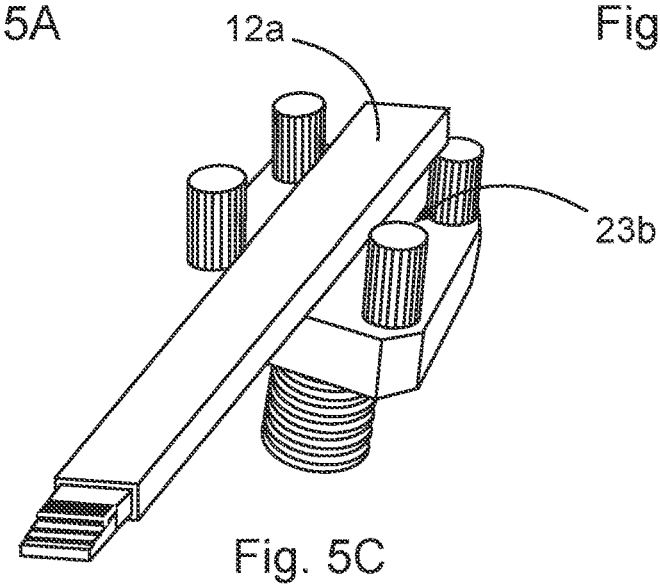
FIG. 5C shows a connection of the electrical terminal connection from FIG. 5A to a first conductor track comprising superconducting material in accordance with an example embodiment.

FIG. 5A shows an electrical terminal connection 23 which is designed to connect the first electrical conductor track 12a to a power electronics system, not illustrated, or to an energy source, likewise not illustrated. The electrical terminal connection 23 is formed at a first end 23a in the manner of a connection screw which, as illustrated in FIG. 5B, projects out of a surface 11 of the printed circuit board 10 in order to be connected to the power electronics system or to the energy source. The electrical terminal connection 23 is soldered at a second end 23b to the first electrical conductor track 12a, as can be seen in FIG. 5C. For this purpose, the electrical terminal connection 23 has at its second end 23b an interface region 25 (FIG. 5A) for connecting the electrical terminal connection 23 to the first electrical conductor track 12a (FIG. 5C) by a solder connection. The interface region 25 in this case forms an electrically conductive contact surface.

Figure 6:
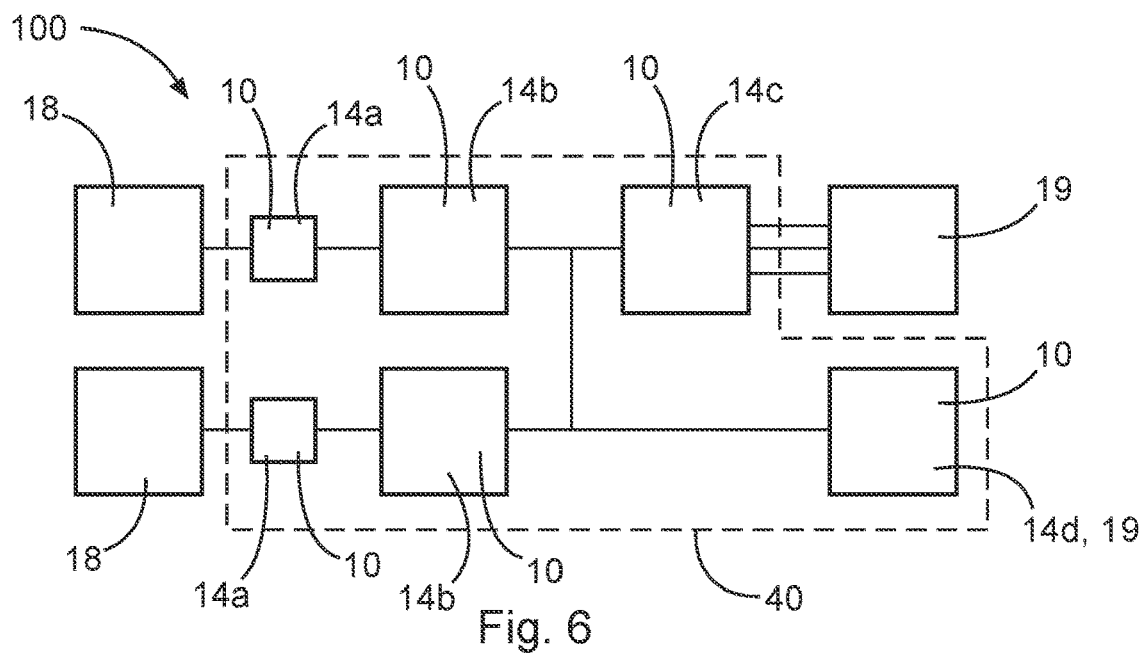
FIG. 6 shows a system having a printed circuit board in accordance with an example embodiment.

FIG. 6 shows a system 100 having the printed circuit board 10, in particular having a plurality of printed circuit boards 10. FIG. 6 may in this case show a system integration of a superconducting printed circuit board 10 in an electric on-board aircraft power supply system, wherein the system 100 is formed at least partly by the on-board aircraft power supply system. The printed circuit boards 10 are arranged together with power electronics systems 14a, 14b, 14c, 14d in a delimited region 40 of the aircraft which has cryogenic temperature properties (approximately 21 K to approximately 77 K), with the result that the superconducting material properties of the superconducting conductor tracks of the respective printed circuit board 10 may be realized. The system 100 is fed with electrical energy by way of one or more energy stores 18, wherein the energy stores 18 in the illustrated example comprise a battery and a fuel cell as energy source. The power electronics systems are formed by way of miniature circuit breakers 14a, electrical converters 14b (for example DC-DC converters) and an inverter 14c (for example DC-AC converter), which are arranged between the energy stores 18 and consumers 19. In the example illustrated, the consumers 19 are electric motors. As can be seen, an electric motor is also located in the cryogenic region 40 of the aircraft. This electric motor comprises in particular an integrated power electronics system 14d which has for example a printed circuit board 10 which in turn comprises superconducting conductor tracks 12. Almost all the components including the power electronics systems are thus arranged in the cryogenic temperature region 40 of the on-board aircraft power supply system, which reduces the occurrence of disadvantageous temperature transitions in the conductor tracks 12 or between the electronic component parts of the on-board power supply system. As illustrated, even an electric motor 19 may be arranged in the cryogenic temperature region 41, such that a temperature jump between the power electronics systems 14a, 14b which are connected upstream and the power electronics system 14d which is integrated into the electric motor 19 is not present or is present only in a weakened form.

The electric current intensity I of the on-board power supply system shown may be for example a few 100 A to a few kA. The voltage U may be lower than 600 V and the power P may be a few 100 kW to a few MW. However, it is understood that the system according to the disclosure herein may also be operated within other electrical and thermal boundary conditions, provided the superconducting conductor tracks of the printed circuit boards 10 are able to develop the aforementioned properties.

Figure 7:
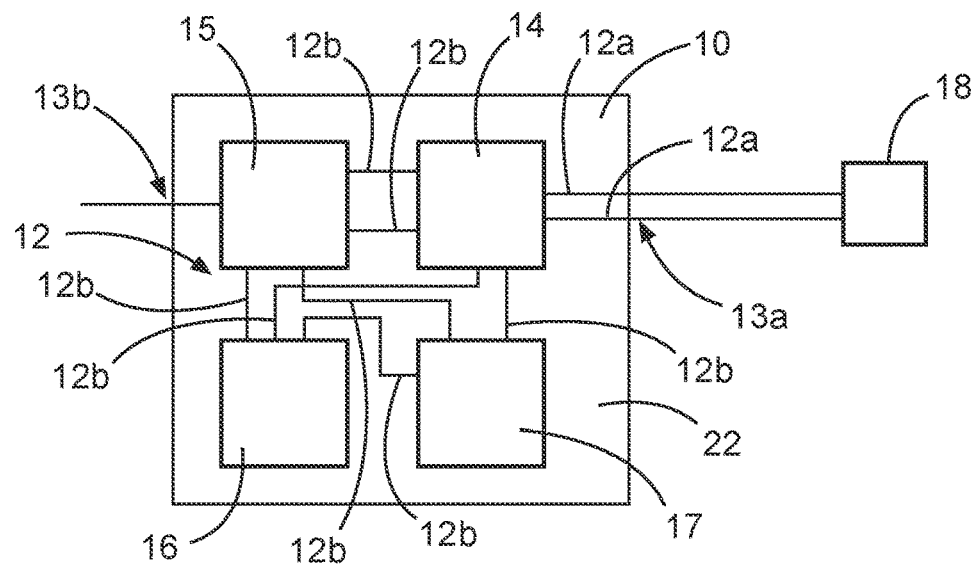
FIG. 7 shows a printed circuit board having a power and signal electronics system in accordance with an example embodiment.

FIG. 7 shows a printed circuit board 10 having power and signal electronics systems and a plurality of electrical conductor tracks 12 which connect the power and signal electronics systems to one another and to external terminal connections. In particular, FIG. 7 shows a printed circuit board 10 comprising integrated superconducting materials 12a, 14 (power unit) and signal electronics systems 12b, 15, 16, 17 for the purpose of supply, actuation and measurement value detection (in a standard copper design). Electrical conductor tracks 12a, 13a close an electrical circuit between an electrical energy store 18 and a power electronics system 14. The power input is provided via the first conductor track 12a which is designed comprising superconducting material and the power output is provided via the further conductor track 13a which is designed comprising superconducting material. It should be noted that component part 18 may also be a power consumption element, that is to say a consumer, instead of an energy store.

The printed circuit board 10 illustrated here is designed in such a way that all of the signal electronics systems 15, 16, 17 are formed by conventional conductor tracks 12b, 13b with non-superconducting material properties. The signal electronics systems comprise an actuation electronics system 15, a supply 16 and a measurement electronics system 17. In contrast, the power electronics system 14 is formed by conductor tracks 12a, 13a with superconducting material properties. In this case, both the signal electronics systems 15, 16, 17 and the power electronics system 14 are formed on one and the same printed circuit board 10. All of the described power and signal electronics systems 14, 15, 16, 17 and conductor tracks 12a, 12b, 13a, 13b may be mounted in particular on or in the frame 22 of the printed circuit board 10.

In comparison with conventionally designed printed circuit boards which are connected to power electronics systems and do not have superconducting properties, the design of the printed circuit board 10 shown here offers a significantly more compact structure, better electrical properties, in particular higher switching frequencies, less interference coupling, a better switching behavior, a lower weight and an improved connection of all of the constituent parts of the electrical circuit as well as a higher flexibility in the configuration of the electrical structure.

Figure 8:
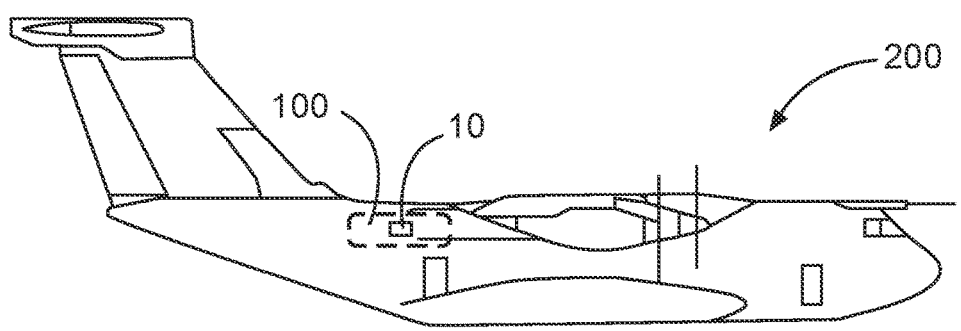
FIG. 8 shows an aircraft having the system illustrated in FIG. 6 in accordance with an example embodiment.

FIG. 8 shows an aircraft 200 in particular having the system 100 or on-board aircraft power supply system described and shown in FIG. 6. In this case, one or more printed circuit boards 10 with the properties described herein are provided within the system 100.

It is additionally pointed out that "comprising" does not rule out other elements or steps, and "a" or "an" do not rule out a multiplicity. It is also pointed out that features or steps that have been described with reference to one of the above example embodiments may also be used in combination with other features or steps of other example embodiments described above. Reference signs in the claims are not to be regarded as limiting.

While at least one example embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the example embodiment(s). As noted, in this disclosure the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A printed circuit board for transmitting electrical energy and for signal transmission, the printed circuit board comprising:
   a plurality of electrical conductor tracks coupled to the printed circuit board;
   the plurality of electrical conductor tracks comprising a first electrical conductor track which comprises a superconducting material;

wherein the first electrical conductor track is configured to provide electrical energy directly to a power electronics system;

wherein the plurality of electrical conductor tracks includes a second electrical conductor track having non-superconducting material properties configured to provide a signal transmission to a signal electronics system;

wherein the plurality of electrical conductor tracks includes a further electrical conductor track which comprises a superconducting material and is configured in a form of a strip; and wherein the first electrical conductor track comprising superconducting material and the further electrical conductor track comprising superconducting material are in a stacked arrangement in or on a frame of the printed circuit board.

2. The printed circuit board of claim 1, wherein:
the power electronics system is integrated into the printed circuit board; and/or
the signal electronics system is integrated into the printed circuit board.

3. The printed circuit board of claim 1, wherein the first electrical conductor track comprising superconducting material is configured to transmit electric current of at least 400 A.

4. The printed circuit board of claim 1, comprising:
an electrical terminal connection configured to connect the first electrical conductor track to the power electronics system or to an energy source;
wherein the electrical terminal connection is formed at a first end in a manner of a connection screw which projects out of a surface of the printed circuit board and can be connected to the power electronics system or to the energy source; and
wherein the electrical terminal connection is soldered at a second end to the first electrical conductor track.

5. The printed circuit board of claim 4, wherein:
the electrical terminal connection has, at the second end thereof, an interface region for connecting the electrical terminal connection to the first electrical conductor track; and
the interface region has an electrically conductive contact surface of at least 140 mm$^2$.

6. The printed circuit board of claim 1, wherein the first electrical conductor track comprising superconducting material and the further electrical conductor track comprising superconducting material mutually cross one another and are soldered to one another in a region of the mutual crossing.

7. The printed circuit board of claim 1, wherein the first electrical conductor track is constructed of a plurality of materials or layers.

8. The printed circuit board of claim 7, wherein the plurality of materials or layers include a ceramic layer.

9. The printed circuit board of claim 7, wherein the plurality of materials or layers include a silver contact layer.

10. The printed circuit board of claim 7, wherein the plurality of materials or layers include a copper sheath.

11. The printed circuit board of claim 1, wherein the first electrical conductor track comprising superconducting material is in a form of a strip which is integrated in a frame of the printed circuit board.

12. The printed circuit board of claim 11, wherein the strip of the first electrical conductor track has a width of at least 10 mm and a height of at most 0.08 mm.

13. The printed circuit board of claim 1, wherein the first electrical conductor track is provided in a form of a strip having a width of at least 10 mm and a height of at most 0.08 mm.

14. A system, comprising:
the printed circuit board of claim 1,
wherein the printed circuit board is arranged together with the power electronics system in a region of the system, the region having cryogenic temperature properties.

* * * * *